(12) United States Patent  
Watanabe et al.

(10) Patent No.: US 7,939,187 B2  
(45) Date of Patent: May 10, 2011

(54) APATITE-CONTAINING FILM HAVING PHOTOCATALYTIC ACTIVITY AND A PROCESS FOR PRODUCING IT

(75) Inventors: Toshiya Watanabe, Fujisawa (JP); Naoya Yoshida, Ebina (JP); Masato Wakamura, Kawasaki (JP)

(73) Assignees: Fujitsu Limited, Kawasaki (JP); Toudai TLO, Ltd., Tokyo (JP)

( * ) Notice: Subject to any disclaimer, the term of this patent is extended or adjusted under 35 U.S.C. 154(b) by 589 days.

(21) Appl. No.: 11/045,125

(22) Filed: Jan. 31, 2005

(65) Prior Publication Data

US 2005/0196620 A1    Sep. 8, 2005

Related U.S. Application Data

(63) Continuation-in-part of application No. 10/864,340, filed on Jun. 10, 2004, now abandoned.

(30) Foreign Application Priority Data

Dec. 9, 2003  (JP) ................................ 2003-409885  
Dec. 7, 2004  (JP) ................................ 2004-353700

(51) Int. Cl.  
*B32B 9/00*  (2006.01)

(52) U.S. Cl. ......... 428/702; 428/701; 428/426; 428/432

(58) Field of Classification Search .................. 428/432, 428/428, 699, 697, 698, 701, 702  
See application file for complete search history.

(56) References Cited

U.S. PATENT DOCUMENTS

| 5,030,474 | A | 7/1991 | Saita et al. | |
|---|---|---|---|---|
| 5,766,669 | A | 6/1998 | Pugh et al. | |
| 5,981,425 | A * | 11/1999 | Taoda et al. | 502/208 |
| 6,485,838 | B1 * | 11/2002 | Shimada et al. | 428/429 |
| 6,777,357 | B2 | 8/2004 | Aso et al. | |
| 7,030,058 | B1 * | 4/2006 | Nakabayashi | 502/401 |
| 2003/0219624 | A1 | 11/2003 | Aso et al. | |
| 2005/0170220 | A1 * | 8/2005 | Aso et al. | 428/702 |

FOREIGN PATENT DOCUMENTS

| CN | 1459477 A | 12/2003 |
|---|---|---|
| EP | 0 322 250 A1 | 6/1989 |
| JP | 1-168872 | 7/1989 |
| JP | 9-056805 | 3/1997 |
| JP | 10-287411 | 10/1998 |
| JP | 2000-327315 | 11/2000 |
| JP | 2001-97705 | 4/2001 |

(Continued)

OTHER PUBLICATIONS

Chinese Office Action for Application No. 200410076670.8 mailed Nov. 4, 2005.

(Continued)

*Primary Examiner* — Timothy M Speer  
(74) *Attorney, Agent, or Firm* — Staas & Halsey LLP (57) ABSTRACT

An apatite-containing film having photocatalytic activity is produced by a process comprising the steps of preparing a liquid mixture comprising a Ca-containing compound and a P-containing compound, subjecting the liquid mixture to reaction to prepare an apatite-precursor composition, applying the apatite-precursor composition to a substrate, and drying the applied apatite-precursor composition. The process may further comprise a heating step after the drying step. The apatite-precursor composition is preferably in the form of a sol.

12 Claims, 5 Drawing Sheets

FOREIGN PATENT DOCUMENTS

JP   2001-302220   10/2001
JP   2003-175338   6/2003

OTHER PUBLICATIONS

European Search Report for EP 04 25 3440 mailed April 25, 2005.
Toshiya Watanabe, et al., "Photocatalytic Activity and Photo-Induced Wettability Conversion of $TiO_2$ Thin Film Prepared by Sol-Gel Process on a Soda-Lime Glass", Journal of Sol-Gel Science and Technology, vol. 19, 2000, pp. 71-76.
Japanese Office Action mailed on May 11, 2010 in counterpart Japanese patent Application No. 2004-353700.
Preparation of Nanohydroxyapatite by a Sol-Gel Method Using Alginic Acid as a Complexing Agent, J. A. Ceram. Soc. 92[10], 2207-2211 (2009).
U.S. Appl. No. 12/656,776, filed Feb. 16, 2010, Toshiya Watanabe.
Office Action for co-pending U.S. Appl. No. 12/656,776; mailed Oct. 20, 2010.

* cited by examiner

APATITE-CONTAINING FILM HAVING PHOTOCATALYTIC ACTIVITY AND A PROCESS FOR PRODUCING IT

This is a continuation-in-part application of U.S. patent application Ser. No. 10/864,340 filed on Jun. 10, 2004 now abandoned.

BACKGROUND OF THE INVENTION

This invention relates to an apatite-containing film having photocatalytic activity, a light-transmitting materials comprising said film, and a process for producing said film.

Recently, photocatalysts are intensively investigated with a view to imparting antifouling, odor-masking and antibacterial properties to building materials (e.g. plate glass and tiles), electronic equipment (e.g. personal computers and cell phones), consumer electric appliances (e.g. refrigerators and air cleaners), interior furnishings (e.g. curtains), household goods, medical tools, and the like. (see K. Hashimoto and A. Fujishima, "Sanka chitan hikari shokubai no subete—kohkin, bouo, kuhki joka no tameni—(All About Titanium Oxide Photocatalysts—For Antibacterial, Antifouling and Air Cleaning Purposes—)", CMC, 1988; and K. Hashimoto, "Saishin hikari shokubai gijutsu to jitsuyoka senryaku (Latest Photocatalysis Technolgoy and Its Implementation Strategies)", BKC, 2002). Products containing photocatalysts exhibit the desired characteristics in themselves. Furthermore, they can decompose contaminants in the surrounding environment, thus contributing to environmental clean-up.

Consider, for example, personal computers and cell phones. A problem with them is that lipids, proteins and carbohydrates from hands, tobacco tar, contaminants in the atmosphere, viruses, bacteria, fungi, and the like are likely to adhere to the keyboard, mouse, buttons and casing, often impairing the appearance of the equipment. In particular, a transparent cover of a display device as a part of such equipment has a strong need for antifouling property in order to retain their light-transmitting properties. Similarly, building materials for daylight have a strong need for antifouling property in order to retain their light-transmitting properties. Attempts are therefore being made to impart antifouling and antibacterial properties by adding photocatalytic materials to those components and materials.

The photocatalytic reaction comprises a stage where the reactant is adsorbed on the catalyst; and a stage where electrons and/or holes, which is generated by light absorption of the catalyst, move to adsorbed species that then undergo reaction. Conventionally, from the viewpoint of electron and/or hole generation by absorption of light, semiconductor materials have drawn researcher's attention as photocatalytic materials. A representative material is titanium dioxide ($TiO_2$).

When a semiconductor material absorbs photons having a larger energy than its band gap, electrons in the valance band are excited to the conduction band, leaving holes in the valence band. If the generated electrons and holes move to adsorbed species, the absorbed species are reduced and oxidized, respectively. In the case of titanium dioxide, adsorbed water is oxidized to generate hydroxyl radicals ($.OH$) whereas adsorbed oxygen is reduced to generate superoxide anions ($.O_2^-$). These radicals and anions in turn react with other adsorbed species and contribute to their oxidation and decomposition.

Titanium dioxide exhibits the desired characteristics in terms of electron and hole generation. However, it also has the following problems. First, among the substances that are needed to be removed by photocatalytic reaction are those which are not easily adsorbed on titanium dioxide. It is often difficult to fully remove such substances by titanium dioxide. This is why there has been a need for photocatalytic materials having high adsorbing capability.

As an additional problem, even though each of a substrate and a titanium dioxide film deposited on the substrate has a good light-transmitting property by itself, combination of the substrate and the deposited film may deteriorate transparency of the material as a whole. Such deterioration is caused by a large refractive index mismatch between the titanium dioxide film and the substrate. In the presence of such a large refractive index mismatch, light reflected on the surface of the $TiO_2$ film may disadvantageously interfere with light passing through the film to be reflected on the interface as well as light of multiple reflection, thereby producing interference fringes.

Exemplified products that are required to have good light-transmission include a protective cover of a display device and a transparent building material. In most cases, these products employ glass as the substrate. The refractive index of titanium dioxide is about three times that of glass. Therefore, in order to suppress the occurrence of interference fringes in those products, it is also desired to develop photocatalysts having refractive indices close to that of glass.

If the areas to be provided with photocatalytic activity are large, photocatalytic materials must be formed in film. It is known to form films of photocatalytic materials by physical deposition techniques such as sputtering and laser ablation, but these techniques require forming films under vacuum. They also involve difficulty in forming uniform, large-area films. A further problem is that the performance of the photocatalytic materials decreases during the process of ion collision or laser irradiation. Another known method comprises the steps of preparing a photocatalytic material, dividing it into particles, and applying them together with a binder to form a film. However, this method suffers a problem of lowered photocatalytic activity because the binder blocks the contact between the photocatalyst and the atmosphere. Hence, it is also desired to develop a simple method for preparing large-area films having good photocatalytic activity.

A Ti-containing calcium hydroxyapatite has been reported as a photocatalytic material that satisfies the requirements on adsorbing capability and refractive index (see JP 2000-327315 A). However, the apatite is rarely soluble and has great tendency to precipitate, thus presenting difficulty in controlling the reaction of the starting materials and the thickness of the formed film in the wet process. Therefore, no simple method has been reported for preparation of apatite films having photocatalytic activity and transparency.

SUMMARY OF THE INVENTION

The present invention has been accomplished under these circumstances and has as an object providing an apatite-containing film having photocatalytic activity.

Another object of the invention is to provide a light-transmitting material comprising such a film.

Yet another object of the invention is to provide a process for producing such a film.

As a result of their intensive studies made to attain those objects, the present inventors found that apatite-containing films having photocatalytic activity could be produced by applying an apatite-precursor composition to a substrate and drying the applied composition. The present invention has been accomplished on the basis of these findings. According to the present invention, an apatite-containing film having photocatalytic activity can be prepared at normal pressure, and it is also possible to provide a light-transmitting material comprising an apatite-containing film having photocatalytic activity.

Specifically, the present invention provides the following.
(1) A process for producing an apatite-containing film having photocatalytic activity, which comprises the steps of:
preparing a liquid mixture comprising a Ca-containing compound and a P-containing compound;
subjecting the liquid mixture to reaction to prepare an apatite-precursor composition;
applying the apatite-precursor composition to a substrate; and
drying the applied apatite-precursor composition.
(2) The process according to (1), wherein the liquid mixture comprising a Ca-containing compound and a P-containing compound further comprises a Ti-containing compound.
(3) The process according to (1) or (2), wherein the apatite-precursor composition is in the form of a sol.
(4) The process according to any one of (1)-(3), wherein the apatite-precursor composition comprises alcohol, ether, polyethyleneglycol, polyoxymethylene, or a combination thereof.
(5) The process according to any one of (1)-(4), which further comprises the step of heating the apatite-precursor composition such that a maximum temperature is in the range of 400-800° C. after the drying step.
(6) The process according to any one of (2)-(5), wherein the following relation:

$$0.0001 \leq X_{Ti}/(X_{Ca}+X_{Ti}) \leq 0.15$$

is satisfied,
wherein $X_{Ca}$ represents the number of moles of Ca in the apatite, and $X_{Ti}$ represents the number of moles of Ti in the apatite.
(7) The process according to any one of (1)-(6), wherein the apatite is calcium hydroxyapatite.
(8) The process as described under (7), wherein the calcium hydroxyapatite contains Ti atoms occupying Ca sites.
(9) The process according to any one of (1)-(8), wherein the substrate is made of glass.
(10) The process according to any one of (1)-(9), wherein the apatite-containing film has an angle of contact with water within the range of 30-60°, and the change in the angle of contact with water induced by light irradiation at 3 mW/cm² for 700 hours is within 5°.
(11) An apatite-containing film having photocatalytic activity, which is produced by preparing a liquid mixture comprising a Ca-containing compound and a P-containing compound;
subjecting the liquid mixture to reaction to prepare an apatite-precursor composition;
applying the apatite-precursor composition to a substrate; and
drying the applied apatite-precursor composition.
(12) The apatite-containing film according to (11), wherein the apatite-precursor composition further comprises alcohol, ether, polyethyleneglycol, polyoxymethylene, or a combination thereof.
(13) A light-transmitting material which has a substrate and the apatite-containing film according to (11) or (12), and which has a light transmittance of at least 85% and a light reflectance of no more than 15% at wavelengths of 400-700 nm.
(14) The light-transmitting material according to (13), wherein the substrate is made of glass.
(15) A display device comprising the light-transmitting material according to (13) or (14).
(16) A building material comprising the light-transmitting material according to (13) or (14).
(17) An apatite-precursor composition in the form of a sol for preparation of an apatite-containing film having photocatalytic activity.
(18) An apatite-precursor composition in the form of a sol formed by preparing a liquid mixture comprising a Ca-containing compound and a P-containing compound; and reacting the liquid mixture to form into the apatite-precursor composition.

DETAILED DESCRIPTION OF THE INVENTION

In accordance with an aspect of the present invention, there is provided a process for preparing an apatite-containing film having photocatalytic activity comprising the steps of preparing a liquid mixture comprising a Ca-containing compound and a P-containing compound; subjecting the liquid mixture to reaction to prepare an apatite-precursor composition; applying the apatite-precursor composition to a substrate; and drying the applied apatite-precursor composition. These steps can all be performed at normal pressure. Hence, the process of the invention does not require any special equipment such as a vacuum system. In addition, a large-area film can be prepared at low cost according to the process of this invention.

As used herein, the term "photocatalyst" refers to a catalyst whose activity increases under light irradiation as compared to that in the absence of irradiation. The reactants for which the apatite-containing film of the invention show catalytic activity include, without limitation, those substances which generally undergo photocatalysis, for example, the substances described in K. Hashimoto and A. Fujishima, CMC, 1988, supra, and K. Hashimoto, BKC, 2002, supra. Exemplary reactants include organics such as alcohols, aldehydes and halides; inorganics such as NOx and SOx; lipids; proteins such as albumin; viruses; bacteria; and fungi.

The expression "having photocatalytic activity" refers to the capability of working as a photocatalyst and encompasses the detection of:
i) both a significant increase in the concentration of carbon dioxide in the presence of a reactant and a significant decrease in the concentration of the reactant; and/or ii) decomposition of a dye such as methylene blue Apatite refers to substances that have the same crystal structure as fluoroapatite [$Ca_{10}(PO_4)_6F_2$] and have the formula:

$$A_x(BO_y)_z X_s \cdot n(H_2O)$$

wherein A represents Ca, Ti, Sr, Ba, Pb, Na, K, Y, Ce, Co, Ni, Cu, Al, La, Cr, Fe, Mg or combinations thereof; B represents P, S, V, Si, As or combinations thereof; X represents F, Cl, OH, O or combinations thereof; y is a value determined by B; x, z and s are values determined by the valencies of A, ($BO_y$) and X, respectively; n is in the range of 0-20. All or a part of A, ($BO_y$) and X may be replaced with other ions.

Figure 1:
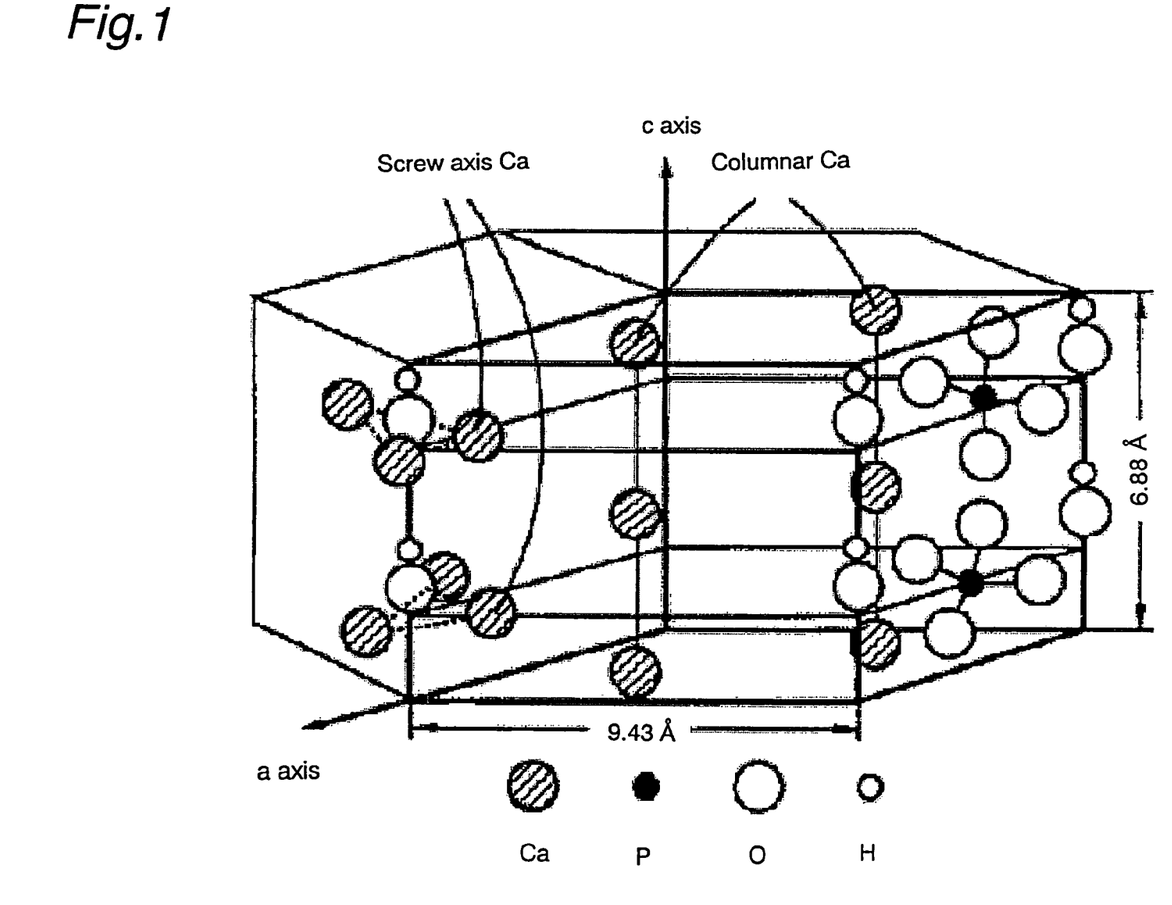
FIG. 1 shows the crystal structure of calcium hydroxyapatite.

The apatite encompasses fluoroapatite, chloroapatite and hydroxyapatite. In the present invention, the apatite is preferably calcium hydroxyapatite. The term "calcium hydroxyapatite" (which is hereunder abbreviated as CaHAP) refers to $Ca_{10}(PO_4)_6(OH)_2$, which may have partial substitution of Ca, ($PO_4$) and/or OH. FIG. 1 shows the crystal structure of $Ca_{10}(PO_4)_6(OH)_2$.

The apatite-containing film may contain substances other than apatite. For example, it may contain calcium carbonate and calcium phosphate that have been formed as by-products. It should, however, be noted that among the components of the apatite-containing film, apatite accounts for the largest proportion by weight.

The first step in the process of the invention is to prepare a liquid mixture comprising a Ca-containing compound and a P-containing compound. The liquid mixture may further contain a solvent. The liquid mixture is not limited to solutions and encompasses suspensions.

The Ca-containing compounds include, without limitation, complexes (e.g. calcium EDTA), calcium nitrate, calcium sulfate and calcium oxalate. The P-containing compounds include, without limitation, phosphorus pentoxide, phosphoric acid and ammonium phosphate. The solvents include, without limitation, water, alcohols (e.g. methanol, ethanol, n-propanol, isopropanol, n-butanol and t-butanol), ethers (e.g. diethyl ether, diisopropyl ether, tetrahydrofuran and dioxane), carbon halides (e.g. methylene chloride, ethylene chloride, chloroform and carbon tetrachloride), aliphatic hydrocarbons (e.g. hexane), cyclic hydrocarbons (e.g. cyclohexane), aromatic hydrocarbons (e.g. benzene, toluene and xylene), and combinations thereof.

The liquid mixture may further comprise a Ti-containing compound. The Ti-containing compounds include, without limitation, titanium alkoxides, titanium complexes and titanium-containing salts. Exemplary titanium alkoxides include titanium tetraisopropoxide, titanium tetra-n-butoxide, titanium tetramethoxide and titanium tetraethoxide. Exemplary titanium complexes include titanium EDTA, titanium acetylacetonato, titanium octylene glycolate, titanium tetraacetyl acetonato, titanium ethyl acetoacetate, titanium lactate and titanium triethanolaminate. Exemplary titanium-containing salts include titanium sulfate, titanium nitrate, titanium trichloride and titanium tetrachloride.

The amount of the Ti-containing compound is determined such that $X_{Ti}/(X_{Ca}+X_{Ti})$ in the apatite produced (where $X_{Ca}$ represents the number of moles of Ca in the apatite and $X_{Ti}$ represents the number of moles of Ti in the apatite) is at least 0.0001, preferably at least 0.001, and more preferably at least 0.01, but is no more than 0.15, preferably no more than 0.125. If $X_{Ti}/(X_{Ca}+X_{Ti})$ is less than 0.0001, significant photocatalytic activity may not be obtained; if $X_{Ti}/(X_{Ca}+X_{Ti})$ exceeds 0.15, an undesired phase may appear, occasionally leading to lowered photocatalytic activity. Ti atoms preferably occupy at least one type of the Ca sites, resulting in substitution of Ca atoms. However, Ti atoms may further occupy other sites.

The liquid mixture may further comprise compounds containing other elements than Ca, P and Ti. For example, it may additionally comprise a F-containing compound in order to replace a part of X with F. Exemplary F-containing compounds include trifluoroacetic acid, hexafluorophosphoric acid, ammonium hexafluorophosphate and ammonium fluoride.

A pH modifier and an inhibitor for the decomposition of the Ti-containing compound, if necessary, may be added to the liquid mixture. A reaction initiator and a reaction accelerator may also be added to the liquid mixture. These reagents may be added during the step of preparing the liquid mixture or they may be added in subsequent steps.

The thus prepared liquid mixture is subjected to reaction to prepare an apatite-precursor composition. Reaction of the liquid mixture may be performed by agitating it at room temperature or by heating it appropriately. The step of preparing the liquid mixture and that of subjecting the liquid mixture to reaction may be carried out simultaneously.

The reaction of the liquid mixture means a reaction involving the Ca-containing compound, P-containing compound, Ti-containing compound, components derived from those compounds, the solvent, and combinations thereof. Examples include: a reaction in which $Ca^{2+}$ and polyphosphate ions agglomerate into fine particles which then form a sol; a reaction in which a titanium alkoxide undergoes a decomposition and/or a polycondensation to form a sol; and a reaction for forming a complex having phosphorus ligands coordinated to the Ti ion. Examples of decomposition of alkoxides include alcoholysis and hydrolysis.

The apatite-precursor refers to a substance that is formed into the apatite by subsequent drying and/or heating. The apatite-precursor may be generated by the reaction of the liquid mixture. Examples include Ca-, P- and Ti-containing colloidal particles. The apatite precursor does not need to have the long-range order of the apatite structure but it preferably has the framework of the apatite structure in local domains. The apatite-precursor composition has preferably fluidity from the viewpoint of coating. An example of the composition having fluidity is a composition in the form of a sol containing fine particles of the apatite precursor. By applying the precursor composition having fluidity to a substrate and producing apatite via chemical reaction on the substrate, a uniform, large-area film having the desired performance can be easily prepared.

In one embodiment, the apatite-precursor composition further contains alcohol, ether, polyethylene glycol, polyoxymethylene, or a combination thereof. These additives may be liquid or solid, at room temperature and normal pressures. Without being bound to any particular theories, these additives can improve properties of the apatite-precursor composition such as volatility and viscosity, resulting in improved uniformity and/or transparency of the film.

The apatite-precursor composition comprises a solvent derived from said liquid mixture. When the solvent has a low boiling point, the composition starts to dry up by vaporization of the solvent immediately after the composition is applied, leading to deterioration of uniformity and transparency of the resulting film. For example, non-uniform precipitation occurs in the drying step. Consequently, white turbidity can be observed with the naked eye, and island-like projections can be detected in the film with a microscope. In contrast, when alcohol, ether, polyethylene glycol, polyoxymethylene, or a combination thereof is added to the apatite-precursor composition, volatility of the composition is suppressed, resulting in improved uniformity and transparency of the film. Alternatively, these additives can enhance viscosity of the composition. Due to the enhanced viscosity, the applied precursor composition can retain its uniform state on the substrate.

Thus, the uniformity and the transparency of the resulting film can improved by controlling the properties of the precursor composition with the additives of alcohol, ether, polyethylene glycol, polyoxymethylene, or a combination thereof. Specifically, scattering of light on the film as well as haze of the film can be reduced.

In another embodiment, the concentration of the precursor composition may be decreased by addition of alcohol, ether, polyethylene glycol, polyoxymethylene, or a combination thereof, resulting in reduced thickness of the film deposited per one coating procedure. Accordingly, the total thickness of the film can be precisely adjusted by changing the number of the coating procedure.

The procedure of adding alcohol, ether, polyethylene glycol, polyoxymethylene, or a combination thereof is not particularly limited. These additives may be added at any timing prior to the step of applying the apatite-precursor composition. For example, these additives may be added to the liquid mixture containing a Ca-containing compound and a P-containing compound, or added during the step of subjecting the liquid mixture to reaction to prepare the apatite-precursor composition, or added to the prepared apatite-precursor composition. Alternatively, the step of adding alcohol, ether, polyethylene glycol, polyoxymethylene, or a combination thereof may be inserted between the step of preparing the apatite-precursor composition and the step of applying the composition on a substrate. In this embodiment, side reactions derived from these additives can be avoided.

Alcohols used in this invention include, without limitation, substituted or unsubstituted $C_1$-$C_{12}$, preferably $C_1$-$C_8$, more preferably $C_1$-$C_6$ aliphatic alcohols, wherein the aliphatic alcohols may be straight or branched; and substituted or unsubstituted $C_6$-$C_{12}$, preferably $C_6$-$C_{10}$, more preferably $C_6$-$C_8$ aromatic alcohols, wherein the aliphatic alcohols may be straight or branched. Aliphatic alcohols include, without limitation, methanol, ethanol, n-propyl alcohol, isopropanol, t-butyl alcohol, n-butyl alcohol, sec-butyl alcohol, and n-hexanol. Aromatic alcohols include, without limitation, phenol, benzyl alcohol, and phenethyl alcohol.

Alcohols used in this invention include alkoxy alcohols. Examples of alkoxy alcohols include the compound having formula (I):

$$R^{11}-O-R^{12}-OH \qquad (I),$$

wherein $R^{11}$ is selected from the group of substituted or unsubstituted $C_1$-$C_{11}$, preferably $C_1$-$C_8$, more preferably $C_1$-$C_6$ alkyl, alkenyl, alkynyl, alkoxyalkyl, alkoxyalkenyl, and alkoxyalkynyl; $R^{12}$ is selected from the group of —$(CH_2)_n$— (n is a integer in the range of 1-11), and $C_1$-$C_{11}$, preferably $C_1$-$C_8$, more preferably $C_1$-$C_6$ alkylene, alkenylene, and alkynylene.

Examples of $R^{11}$ include, without limitation, methyl, ethyl, n-propyl, isopropyl, n-butyl, t-butyl, sec-butyl. Examples of $R^{12}$ include, without limitation, —$(CH_2)$—, —$(CH_2)_2$—, —$(C(CH_3)H)$—, —$(CH_2)_3$—, propylene, butylene, amylene, and hexylene. Alkoxyalcohols include, without limitation, methoxymethanol, ethoxymethanol, 2-methoxyethanol, 1-methoxyethanol, 2-ethoxyethanol, and 1-ethoxyethanol.

Polyethylene glycols used in this invention include, without limitation, compounds having formula (II):

$$R^{21}-(OCH_2CH_2)_n-OR^{22} \qquad (II),$$

wherein $R^{21}$ and $R^{22}$ are independently selected from the group consisting of substituted or unsubstituted $C_1$-$C_{12}$, preferably $C_1$-$C_8$, more preferably $C_1$-$C_6$ alkyl, alkenyl, alkynyl, and hydrogen; n is a integer in the range of 1-1000, preferably 1-500.

Polyoxymethylene used in this invention include, without limitation, compounds having formula (III):

$$R^{31}-(OCH_2)_n-OR^{32} \qquad (III),$$

wherein $R^{31}$ and $R^{32}$ are independently selected from the group consisting of substituted or unsubstituted $C_1$-$C_{12}$, preferably $C_1$-$C_8$, more preferably $C_1$-$C_6$ alkyl, alkenyl, alkynyl, and hydrogen; n is a integer in the range of 1-2000, preferably 1-1000.

The apatite-precursor composition can be applied by any known techniques. Examples include dip coating, spray coating, blade coating, roll coating and gravure coating.

In the step of drying the apatite-precursor composition, not only are the solvent and by-products of the reaction removed but reactions such as decomposition and polymerization are allowed to proceed further, thereby forming the apatite. If the apatite-precursor composition is a sol, it is dried into a gel that in turn forms the apatite-containing film. The drying rate is chosen as appropriate not to cause cracking in the film. The drying temperature is not limited to any particular value as long as it permits removal of the solvent; it is typically at least 80° C., preferably at least 100° C., but not be higher than 400° C., preferably not higher than 250° C.

Following the drying step, the apatite-containing film may be heated to an even higher temperature. By this heating step, the characteristics of the apatite-containing film such as crystallinity, transparency and photocatalytic activity, can be improved. A maximum temperature to be reached in the heating step is at least 400° C., preferably at least 500° C., but not be higher than 800° C., preferably not higher than 700° C. If the maximum temperature is less than 400° C., heating may often prove to be ineffective; if the maximum ultimate temperature exceeds 800° C., the substrate may sometimes be damaged. The heating step is preferably performed in an oxygen-containing atmosphere, say, in the air.

The thickness of the apatite-containing film of the invention is chosen as appropriate for its specific use and is at least 20 nm, preferably at least 50 nm, but not be greater than 10 μm, preferably not greater than 1 μm, more preferably not greater than 500 nm. In order to attain the desired film thickness, a cycle consisting of the coating, drying and heating steps may be repeated. If desired, a cycle consisting of the coating and drying steps may be repeated before the heating step.

Materials for the substrate on which the apatite-containing film is to be formed include, but are not limited to, glass, plastics (e.g. polyacrylate and PET), metals (e.g. aluminum, copper, zinc and nickel), graphite, concrete, nonflammables (e.g. ceramics such as plasterboard, calcium silicate board and flexible board), etc. An undercoat may be formed on the substrate before forming the apatite-containing film. From the viewpoint of light transmission, the substrate is preferably made of a material having a refractive index close to that of the apatite, as exemplified by glass. Examples of the glass include Pyrex glass, soda-lime glass and silica glass. If the drying step is followed by the additional heating step, Pyrex glass and silica glass having high heat resistance are preferred.

The present invention also relates to a light-transmitting material which has a substrate and the apatite-containing film having photocatalytic activity, wherein the apatite-containing film has a light transmittance of at least 85% and a light reflectance of no more than 15% at wavelengths of 400-700 nm. The light transmittance at wavelengths of 400-700 nm refers to the average of the transmittances in the stated wavelength range. The light-transmitting materials of this invention have the light transmittance of at least 85%, preferably at least 88%. The upper limit of the light transmittance is not restricted in any way, but in order to satisfy other characteristics, it is preferably set not to exceed 99%. The light reflectance at wavelengths of 400-700 nm refers to the average of the reflectance in the stated wavelength range. The light reflectance of interest is not higher than 15%, preferably not higher than 12%, more preferably not higher than 10%. The lower limit of the light reflectance is not restricted in any way but in order to satisfy other characteristics, it is preferably set to be at least 1%. Light-transmitting materials that satisfy the above-stated conditions for light transmittance and reflectance can be prepared by the aforementioned process.

In another aspect, the apatite-containing film of the invention can have a property not to undergo phot-induced hydrophilization, in contrast to titanium dioxide. The apatite-containing film of the invention as prepared has an angle of contact with water in the range of 5-20°, and the angle of contact converges in the range of 30-60° after preserved in the light-shielded condition. As used herein, the contact angle means the angle observed after convergence, unless otherwise noted. When this film is subjected to irradiation of black light at 1 mW/cm$^2$ for 80 hours after convergence, the difference between the angles before and after irradiation is no more than 5°. When the film is subjected to irradiation of black light at 3 mW/cm$^2$ for 700 hours after convergence, the difference between the angles before and after irradiation is also no more than 5°. These characteristics prove to be useful in applications that require stable water repellency under light irradiation.

The following examples are provided for further illustrating the present invention but is in no way to be taken as limiting.

EXAMPLES

Example 1

Preparing Substrates

Glass pieces (Corning 137 Glass) measuring 7.5 cm long, 5.5 cm wide and 1.1 mm thick were immersed in a cleaning solution that was a 5-fold dilution of Pure Soft PS (commercially available from As One Corporation). Following 30-min ultrasonication, the glass pieces were washed with distilled water and dried. The dried glass pieces were dip coated with NDH-500A (commercially available from Nippon Soda Co., Ltd.) Dip coating was performed in a nitrogen atmosphere at room temperature with the coated plates being withdrawn at a rate of 24 cm/min. Following the dip coating, each of the pieces was dried at 120° C. for 40 min, and then fired at 500° C. for 30 min to form a $SiO_2$ undercoat. Another cycle of dip coating, drying and firing steps was repeated. The thus obtained $SiO_2$ bearing glass pieces were used as substrates.

Producing Apatite Thin Films

Calcium nitrate tetrahydrate [$Ca(NO_3)_2 \cdot 4H_2O$, 2.125 g] was added to 100 mL of ethanol, and the resulting mixture was stirred at room temperature until the calcium nitrate dissolved completely. To the solution, phosphorus pentoxide ($P_2O_5$, 0.4258 g) was added and the mixture was stirred for an additional 2 hours. Titanium tetraisopropoxide (Ti[OCH$(CH_3)_2]_4$, 0.2842 g) was added to the mixture to form a liquid mixture. The liquid mixture was stirred at room temperature for about 19 hours to effect reaction, thereby yielding a pale yellow sol as an apatite-precursor composition.

The sol was used for dip coating of each substrate in an area of 5 cm×5 cm. Dip coating was performed in a nitrogen atmosphere at room temperature with the coated substrates being withdrawn at a rate of 24 cm/min. The dip-coated samples were dried at 150° C. for 30 min and then fired at 600° C. for 30 min in the atmosphere. The cycle of dip coating, drying and firing steps was repeated 2, 5 or 10 times. The samples prepared by passing through the respective cycles are hereunder designated 2-, 5- and 10-layered coats.

Characterization of the Apatite Films

Film Thickness

Figure 2:
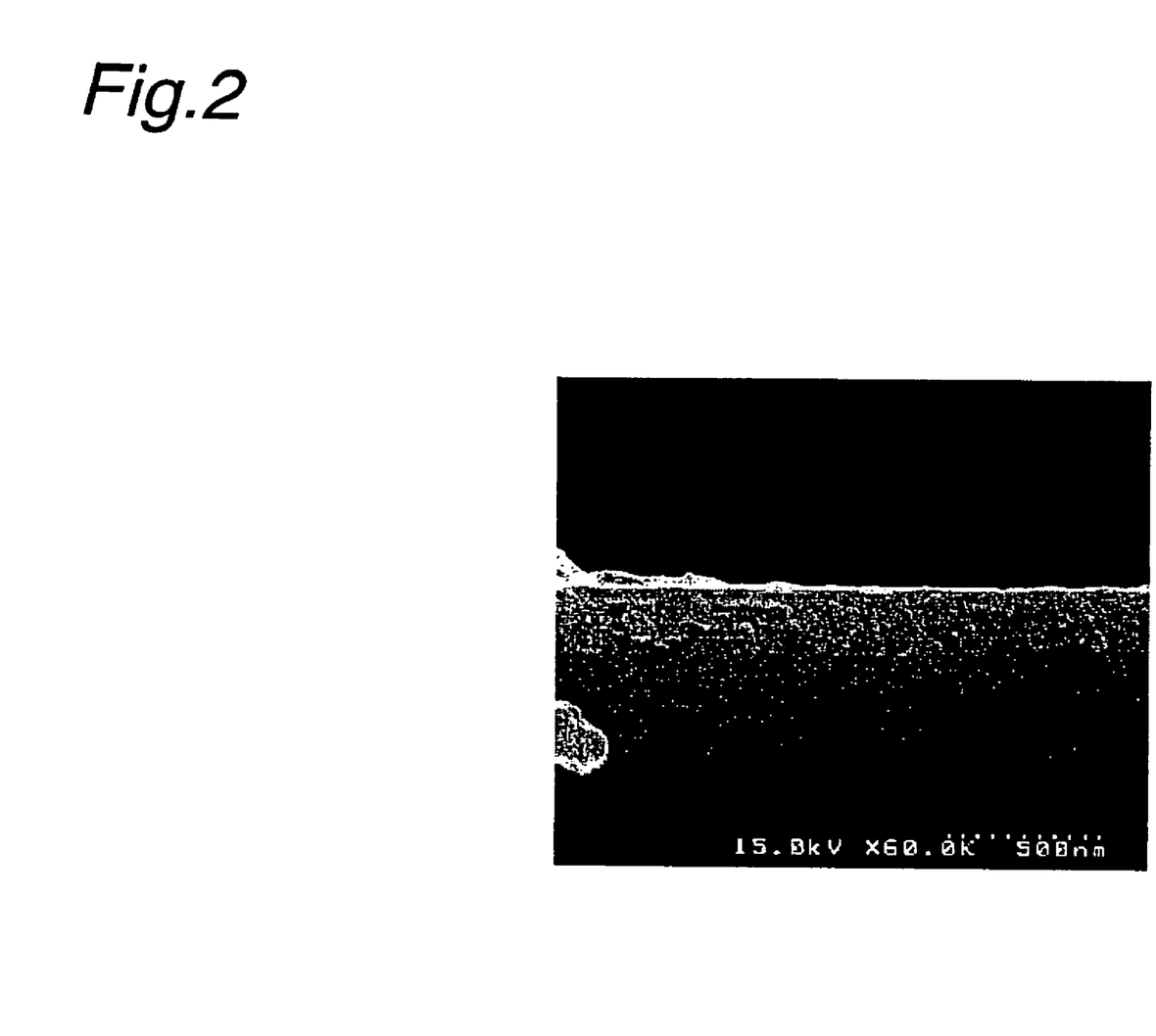
FIG. 2 is a SEM image of a cut surface of an apatite-containing film formed on a glass substrate.

The results of scanning electron microscope observation (SEM; Hitachi S-4200) indicate that the thickness of the 2-layered coat of titanium apatite was about 200 nm (FIG. 2). It was therefore found that a thin film of about 100 nm thickness was produced by a single dip coating procedure.

Compositional Analysis

Surface compositional analysis by X-ray photoelectron spectroscopy (XPS; Model 5600 of Physical Electronics) resulted in the detection of the elements Ca, Ti, P and O. The thin film spectra were similar to those of the powder, with the Ti content being about 10 mol %.

Angle of Contact with Water

Using a contact angle meter (DropMaster 500 of Kyowa Interface Science Co., Ltd.), the aforementioned samples were measured for the angle of contact with water both before and after light irradiation. The angle of contact with water for the samples just after their preparation was about 10°, and converged in the range of 40-50° after preservation in the light-shielded condition. This converged value was referred to as the angle of contact with water before irradiation. Each sample was irradiated with black light at 3 mW/cm$^2$ (FL10BLB of Toshiba Lighting & Technology Corporation) for 700 hours, and was measured again for the angle of contact with water. As it turned out, no significant change in the angle of contact with water was observed even after 700-hr irradiation.

Powder was prepared from the sol, and was subjected to measurement of the angle of contact with water. The results were similar to those of the films.

After each measurement of the angle of contact with water, the sample was dried at 80° C. for 30 min.

Optical Measurements

Figure 3:
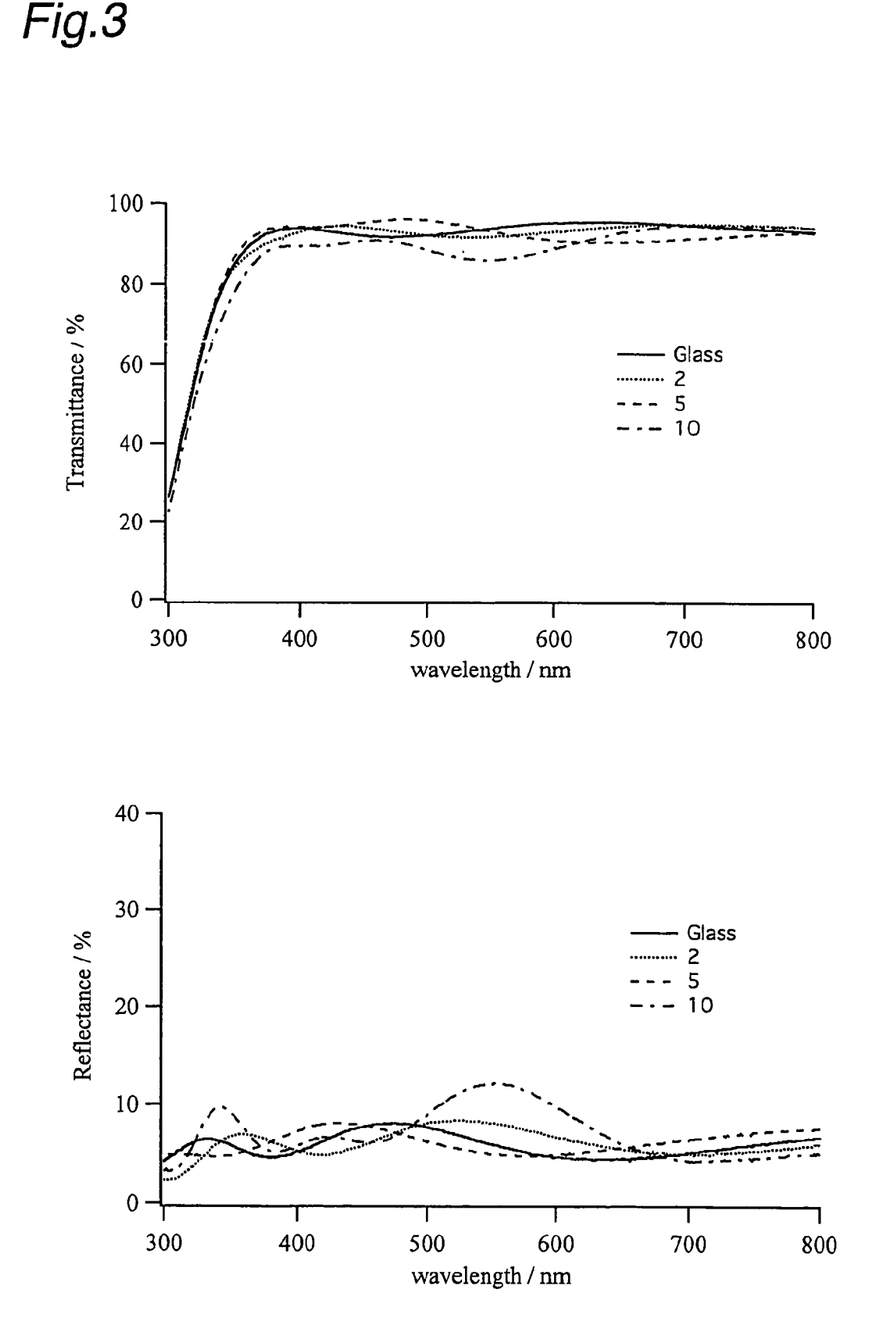
FIG. 3 shows the optical characteristics of the apatite-containing film formed on a glass substrate.

For each of the samples prepared, transmission and absorption spectra were measured using an UV-VIS spectrophotometer (Perkin-Elmer Lambda 900) and an absolute reflection measuring unit (Perkin-Elmer). See FIG. 3 for the results.

The average transmittance at wavelengths of 400-700 nm was 93% for each of the 2-layered coat, the 5-layered coat and the substrate, and 89.8% for the 10-layered coat. The average reflectance at wavelengths of 400-700 nm was 6.5% for the 2-layered coat, 6.1% for the 5-layered coat, 8.1% for the 10-layered coat, and 6.0% for the substrate. Thus, the transmittance and reflectance data on the samples were almost comparable to those on glass used as the substrate and the samples were highly transparent.

Evaluation of Photocatalytic Activity (1) Acetaldehyde Decomposition Test

Each of the samples was placed in a closed vessel (capacity, 1 L; made of silica glass) and the interior of the vessel was replaced with synthetic air. A saturated vapor of acetaldehyde (0.5 mL) was supplied into the vessel by means of a syringe and ultraviolet light was applied (black light at 1 mW/cm$^2$; FL10BLB of Toshiba Lighting & Technology Corporation). At specified time intervals, the gas in the vessel was sampled in a volume of 1 mL by means of a syringe and subjected to gas chromatography (Shimadzu GC-8A combined with FID detector and a column packed with activated carbon and PEG-1000) for quantitative analysis of the residual acetaldehyde and the produced carbon dioxide. As it turned out, the concentration of acetaldehyde decreased and that of carbon dioxide increased, thus verifying the photocatalytic activity of the apatite-containing films.

Figure 4:
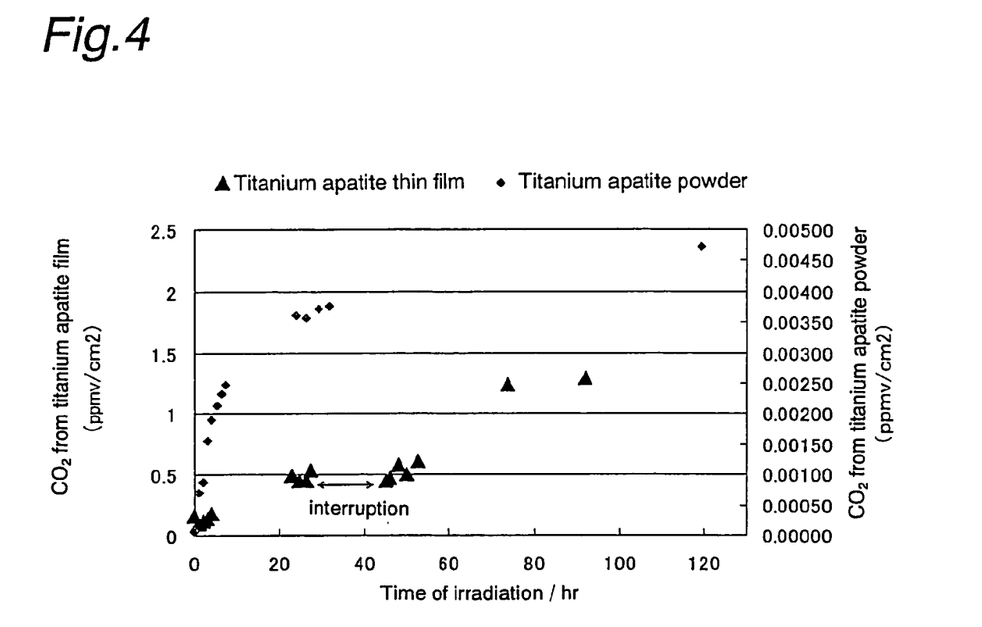
FIG. 4 shows the results of the acetaldehyde-decomposition test for apatite-containing film formed on a glass substrate and an apatite powder.

The results of the 2-layered coat are shown in FIG. 4, as compared with the results from an apatite powder having the same composition. Whereas the apatite-containing powder was irradiated continuously, the film was shielded from light for a certain period of time as indicated in FIG. 4, thereby verifying the dependency of the catalytic activity on light. In FIG. 4, the substrate area on which the film was formed, i.e. 5 cm×5 cm, is regarded to be the area of the film. The apatite-containing film subjected to the evaluation of photocatalytic activity had very high photocatalytic activity, and produced more than 200 ppmv/hr of carbon dioxide in a surface area of 1 m².

(2) Methylene Blue Decomposition Test

The photocatalytic activity of the samples as prepared above was also evaluated by the methylene blue decomposition test.

First, each sample was dipped in 1 mM methylene blue solution for 2 hours, and dried in an environment where light was shielded. Methylene blue decomposition by the sample under UV radiation at 10 mW/cm² was evaluated by measuring UV-VIS absorption spectra over a certain period. The measurement was performed by means of a spectrophotometer (Perkin-Elmer Lambda 900).

Figure 5:
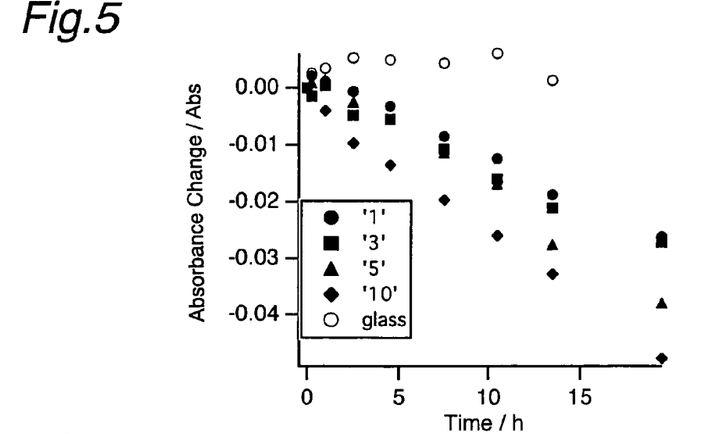
FIG. 5 shows the results of the methylene blue decomposition test for apatite-containing films formed on a glass substrate.

As shown in FIG. 5, methylene blue decomposition was clearly detected for the titanium-apatite film, as compared with a glass substrate without any titanium-apatite films.

Figure 6:
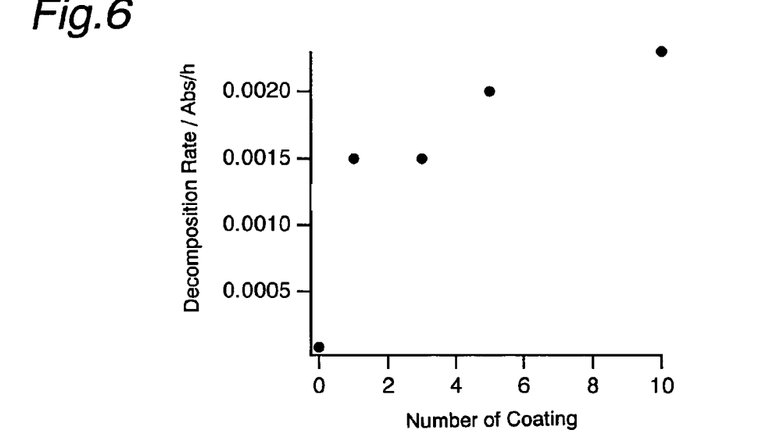
FIG. 6 shows relationship between the thickness of the apatite-containing film and the initial rate of methylene blue decomposition.

The rate of methylene blue decomposition depended on the thickness of the film. FIG. 6 shows the relationship between the number of dip-coating and the initial rate of methylene blue decomposition. The initial rate increased with increasing the number of dip-coating, although the increment of the rate per a dip-coating decreases.

The photocatalytic activity of the titanium-apatite film is less dependent on the thickness than that of a titanium oxide film (see T. Watanabe, S. Fukayama, M. Miyauchi, A. Fujishima, K. Hashimoto, J. Sol-Gel Sci. Tech. 2000, Vol. 19, p. 71-76). This result indicates that the photocatalytic activity is obtained even at lower thickness for titanium-apatite films.

Example 2

Figure 7:
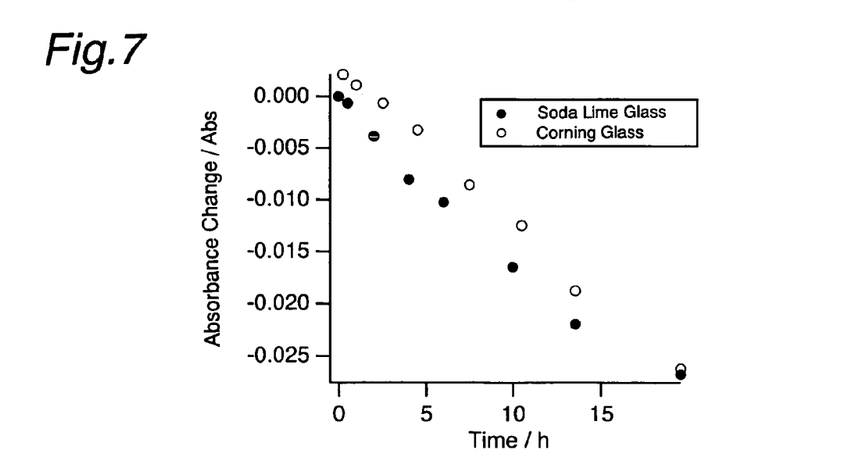
FIG. 7 shows photocatalytic activity of apatite-containing films formed on a soda-lime glass and a corning glass. The activity was evaluated by the methylene blue decomposition test.

Titanium-apatite films were prepared in the same manner as that in Example 1, except that the substrate was replaced with a soda-lime glass. The photocatalytic activity of an 1-layered film was evaluated by the methylene blue decomposition test (FIG. 7). For comparison, FIG. 7 also shows results for the sample having a titanium-apatite film on a corning glass substrate as described in Example 1, and a sample having a titanium oxide film on a soda-lime glass substrate. Each sample of FIG. 7 had an 1-layered coat formed by a single dip coating.

The photocatalytic activity of the titanium oxide film was decreased due to the effects of sodium ion and the like contained in the glass substrate (see T. Watanabe et al., J. Sol-Gel Sci. Tech. 2000, Vol. 19, p. 71-76). In contrast, such decrease of activity was not observed for the titanium-apatite film on a soda-lime glass substrate or a corning glass substrate. These results indicate that the titanium-apatite film can maintain its high catalytic activity for an extended period.

Example 3

Titanium-apatite films were prepared in the same manner as that in Example 1, except that 50 mL of 2-ethoxyethanol was added to the sol obtained by stirring the liquid mixture at room temperature for 19 hours for reaction. Each cycle covered from dip coating to completion of firing, and various samples were prepared by varying the number of the cycle.

In order to determine the thickness of the deposited film per a cycle, a film was formed on a silicon wafer similarly, and the thickness of each layer was measured by ellipsometry. As a result, it was found that the thickness of the layer formed per a cycle was approximately 20 nm.

When the film was prepared without 2-ethoxyethanol as described in Example 1, the thickness of the layer formed per a cycle was approximately 100 nm. Therefore, the thickness of a layer formed per a cycle was reduced by addition 2-ethoxyethanol.

The samples of Example 3 had significantly reduced transparency by the naked eye, as compared with those of Example 1. Specifically, the samples of Example 1 had white turbidity slightly detected by the naked eye, while the turbidity was reduced in the samples of Example 1. The improved transparency is attributed to addition of 2-ethoxyethanol; 2-ethoxyethanol can inhibit the sol from rapidly drying in the applying step, and thus improve the uniformity of the film formed, leading to reduced scattering light of the film.

The photocatalytic activity of the samples of Example 3 was evaluated by the acetaldehyde decomposition test and the methylene blue decomposition test as described in Example 1. As a result, it was found that the photocatalytic activity of the samples of Example 3 was similar to that of Example 1.

The process of the present invention provides a simple method for producing apatite-containing films having photocatalytic activity, as well as light-transmitting materials comprising such apatite-containing films.

The process of the invention can also be employed to produce electronic equipment, in particular, their display devices, keyboards, mouses and casings, as well as building materials that comprise the apatite-containing films. In doing so, outstanding antifouling, odor-masking and antibacterial properties can be imparted without design limitations. The process of the invention can be applied to various uses where transparency is required, such as transparent covers of display devices and transparent building materials, in order to impart desired characteristics without impairing the transparency.

What is claimed is:

1. An article comprising a substrate and an apatite film having photocatalytic activity applied thereon, which is produced by a method comprising:
    preparing a liquid mixture comprising a Ca-containing compound and a P-containing compound;
    subjecting the liquid mixture to reaction to prepare an apatite-precursor composition;
    applying the apatite-precursor composition to the substrate; and
    drying the applied apatite-precursor composition, in which an of the apatite film is represented by $A_x(BO_y)zX_8 \cdot n(H_2O)$, where A includes Ca and may also include at least one of Ti, Sr, Ba, Pb, Na, K, Y, Ce, Co, Ni, Cu, Al, La, Cr, Fe and Mg; B includes P and may also include at least one of S, V, Si and As; X includes at least one element selected from the group consisting of F, Cl, OH and O; y is a value determined by a valency of B; x, z and s are values determined by the valencies of A, $(BO_y)$ and X, respectively; n is in a range of 0-20, and all or a part of A, $(BO_y)$ and X may be replaced with other ions, so long as the apatite film is formed, the apatite film shows light transmittance of at least 85% and a light reflectance of no more than 15% at wavelengths of 400-700 nm, when determined on a light-transmitting material consisting of the film and the substrate, and the apatite film has an angle of contact with water within the range of 30-60°, and a change in the angle of contact with water induced by light irradiation at 3 mW/cm² for 700hours is within 5°; and in which the apatite film has an adsorbing capacity evidenced by a generation of more than 200 ppmv/hr of carbon dioxide from a surface area of 1 m² in an acetaldehyde decomposition test wherein carbon dioxide is produced with decomposition of acetaldehyde, and the acetaldehyde decomposition test is carried out by placing a sample of the apatite film in a closed vessel, introducing a saturated vapor of acetaldehyde, irradiating the sample with ultraviolet light, and quantitatively analyzing a gas in the vessel to determine a concentration of the residual acetaldehyde and produced carbon dioxide.

2. The article according to claim 1, wherein the apatite-precursor composition comprises alcohol, ether, polyethyleneglycol, polyoxymethylene, or a combination thereof.

3. The article according to claim 1, wherein the article is a light-transmitting material which has the substrate and the apatite film.

4. The article according to claim 3, wherein the substrate is made of glass.

5. A display device comprising the light-transmitting material according to claim 3.

6. A building material comprising the light-transmitting material according to claim 3.

7. The article according to claim 1, wherein the apatite-precursor composition is in the form of a sol used for preparation of the apatite film.

8. The article according to claim 7, wherein the apatite-precursor composition is formed by
preparing a liquid mixture comprising a Ca-containing compound and a P-containing compound; and
reacting the liquid mixture to form into the apatite-precursor composition.

9. The article according to claim 1,
wherein the apatite is calcium hydroxyapatite,
wherein the calcium hydroxyapatite contains Ti atoms occupying Ca sites so as to satisfy a relation specified by $0.0001 \leq X_{Ti}/(X_{Ca}+X_{Ti}) < 0.15$, and
wherein $X_{Ca}$ represents a number of moles of Ca in the apatite and $X_{Ti}$ represents a number of moles of Ti in the apatite.

10. The article according to claim 1 wherein A is a combination of Ca and at least one of Ti, Sr, Ba, Pb, Na, K, Y, Ce, Co, Ni, Cu, Al, La, Cr, Fe and Mg; B is a combination of P and at least one of S, V, Si and As; and X is at least two elements selected from the group consisting of F, Cl, OH, O.

11. An apatite film having photocatalytic activity, which is produced by a sol-gel method comprising:
preparing a liquid mixture comprising a Ca-containing compound and a P-containing compound;
subjecting the liquid mixture to reaction to prepare an apatite-precursor composition;
applying the apatite-precursor composition to a substrate; and
drying the applied apatite-precursor composition, wherein the thickness of the apatite film is less than 1.0 µm.

12. The apatite film according to claim 11, wherein the apatite-precursor composition further comprises alcohol, ether, polyethyleneglycol, polyoxymethylene, or a combination thereof.

* * * * *

UNITED STATES PATENT AND TRADEMARK OFFICE
CERTIFICATE OF CORRECTION

| | | |
|---|---|---|
| PATENT NO. | : 7,939,187 B2 | Page 1 of 1 |
| APPLICATION NO. | : 11/045125 | |
| DATED | : May 10, 2011 | |
| INVENTOR(S) | : Toshiya Watanabe et al. | |

It is certified that error appears in the above-identified patent and that said Letters Patent is hereby corrected as shown below:

IN THE CLAIMS:

Column 12, Line 61, In Claim 1, after "an" insert --apatite--.

Column 12, Lines 61-62, In Claim 1, delete "$Ax(BO_y)zX_8 \cdot n(H_2O)$," and insert --$Ax(BO_y)zX_s \cdot n(H_2O)$,--, therefor.

Column 13, Line 14 (Approx.), In Claim 1, delete "700hours" and insert --700 hours--, therefor.

Column 14, Line 18, In Claim 10, delete "claim 1" and insert --claim 1,--, therefor.

Signed and Sealed this
Ninth Day of August, 2011

David J. Kappos
*Director of the United States Patent and Trademark Office*